(12) United States Patent
Drabinski et al.

(10) Patent No.: US 11,211,196 B2
(45) Date of Patent: Dec. 28, 2021

(54) TUNABLE TRANSFORMER

(71) Applicant: Intel IP Corporation, Santa Clara, CA (US)

(72) Inventors: Robin Drabinski, Duisburg (DE); Andreas Loza, Berlin (DE); Vojkan Vidojkovic, Waalre (NL)

(73) Assignee: Intel Corporation, Santa Clara, CA (US)

( * ) Notice: Subject to any disclaimer, the term of this patent is extended or adjusted under 35 U.S.C. 154(b) by 350 days.

(21) Appl. No.: 16/369,383

(22) Filed: Mar. 29, 2019

(65) Prior Publication Data

US 2020/0312539 A1 Oct. 1, 2020

(51) Int. Cl.
| | |
|---|---|
| *H04B 1/38* | (2015.01) |
| *H04L 5/16* | (2006.01) |
| *H01F 29/02* | (2006.01) |
| *H03F 1/26* | (2006.01) |
| *H03F 3/189* | (2006.01) |
| *H03F 3/21* | (2006.01) |
| *H03H 7/38* | (2006.01) |

(52) U.S. Cl.
CPC .......... *H01F 29/025* (2013.01); *H03F 1/26* (2013.01); *H03F 3/189* (2013.01); *H03F 3/211* (2013.01); *H03H 7/38* (2013.01)

(58) Field of Classification Search
CPC .......... H01F 29/025; H03F 1/26; H03F 3/189; H03F 3/211; H03H 7/38; G09G 3/3688; H03B 5/1296; H01L 23/5227

USPC ....... 375/220, 219, 295, 316, 377, 350, 257, 375/258

See application file for complete search history.

(56) References Cited

U.S. PATENT DOCUMENTS

| | | | |
|---|---|---|---|
| 3,277,377 A | 10/1966 | Guyton et al. | |
| 5,262,740 A | 11/1993 | Willems | |
| 6,937,096 B2 | 8/2005 | Wight et al. | |
| 7,526,256 B2 | 4/2009 | Bhatti et al. | |
| 8,149,050 B2 | 4/2012 | Cabanillas | |
| 8,279,018 B1 | 10/2012 | Song et al. | |
| 8,929,945 B1 | 1/2015 | Wei et al. | |
| 9,306,502 B2 | 4/2016 | Chan | |
| 2005/0068146 A1* | 3/2005 | Jessie | H01L 23/5227 336/200 |
| 2006/0033587 A1* | 2/2006 | Cabanillas | H03B 5/1296 331/108 C |

(Continued)

Primary Examiner — Phuong Phu
(74) Attorney, Agent, or Firm — Schiff Hardin LLP

(57) ABSTRACT

Techniques are disclosed implementing a tunable transformer with additional taps in at least one of the three coils. The tunable transformer enables the resonant frequency within RF transceiver matching networks to be adjusted without substantially impacting the output power at resonance. The tunability of the transformer is partially driven by the insertion of additional coils within the transformer, which are selectively switched and may be further coupled with a tunable capacitance. The tunability of the transformer is further driven via the use of at least one multi-tap transformer coil, which allows electronic components to be coupled to different coil taps to thereby facilitate an adjustable DC inductance. Doing so counteracts changes in mutual inductance between the non-switched coils, and facilitates the stabilization of output power with shifts in resonant frequency.

25 Claims, 12 Drawing Sheets

(56) References Cited

U.S. PATENT DOCUMENTS

2009/0179890 A1* 7/2009 Nishimura ........... G09G 3/3688
   345/214
2017/0179216 A1   6/2017 Li et al.

* cited by examiner

TUNABLE TRANSFORMER

TECHNICAL FIELD

Aspects described herein generally relate to transformers and, more particularly, to tunable transformers.

BACKGROUND

In many radio frequency (RF) applications, transceiver systems cover different frequency bands associated with different communication standards. Matching networks, which often include transformers and capacitors, are used in such transceiver systems for selected frequency bands of operation. But because the matching networks have a limited and fixed passband, a single transmit or receive path is not able to cover all operating bands. As a result, the use of matching networks in current transceiver designs is problematic, particularly with regards to wider frequency-band operation.

BRIEF DESCRIPTION OF THE DRAWINGS/FIGURES

The accompanying drawings, which are incorporated herein and form a part of the specification, illustrate the aspects of the present disclosure and, together with the description, and further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1A:
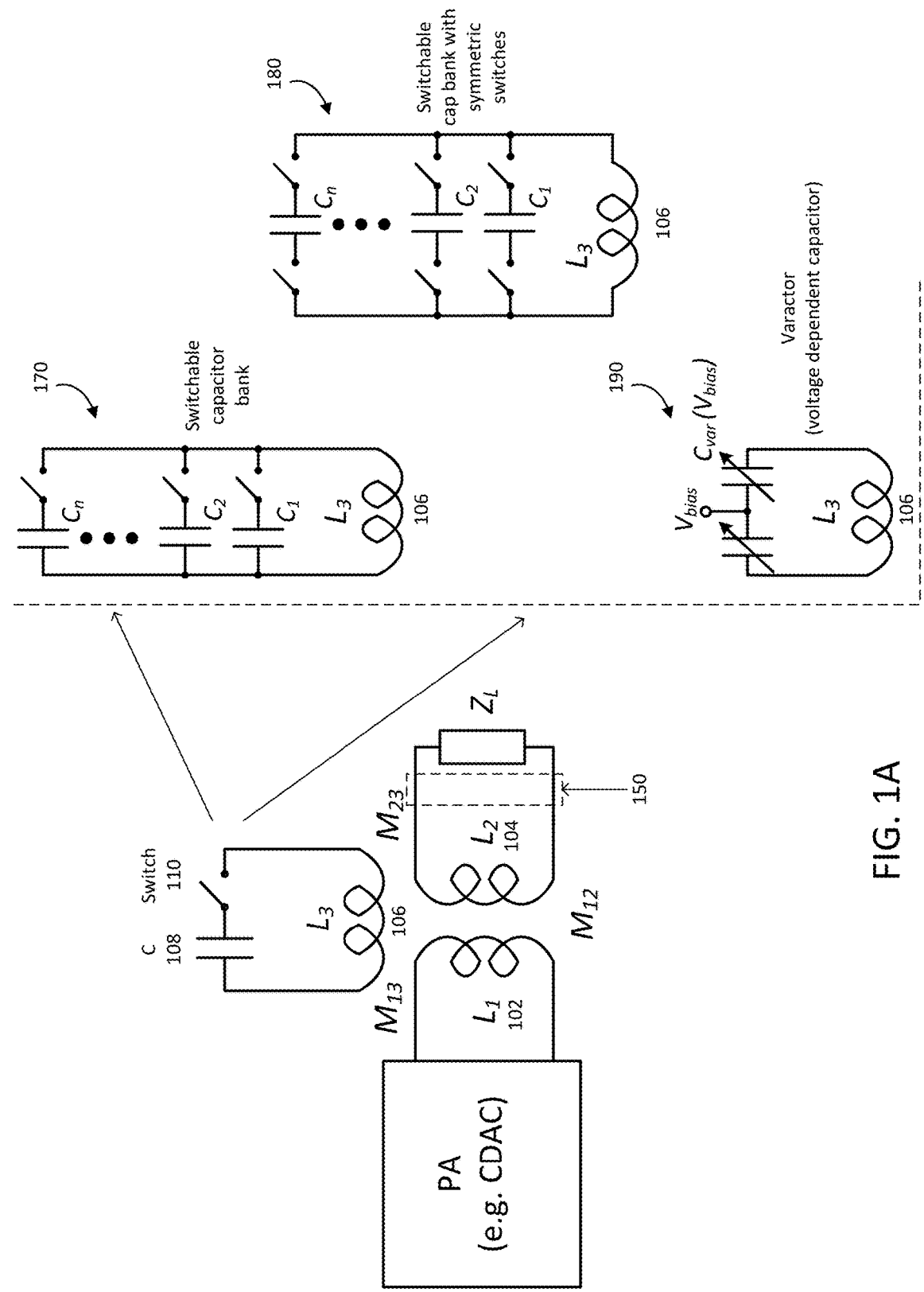
FIG. 1A illustrates a circuit diagram of an exemplary tunable transformer implemented as part of a transmitter, in accordance with an aspect of the disclosure.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

As mentioned above, a single transmit or receive path is not able to cover all operating bands for typical transceiver designs, which is particularly problematic for wider frequency band transceivers, as the matching networks have a limited and fixed passband. To address this issue and to cover additional frequency bands, conventional transceiver designs may implement several transmitter and receiver paths, which are generally integrated onto a single "chip" or die. In such conventional designs, each path generally has its own matching network, which is designed for a specific frequency band of operation. However, such solutions consume a great deal of valuable die area, and involve arduous and expensive design efforts, as each transmitter and receiver path needs to be separately designed and tuned for each frequency band.

Therefore, to address these issues, the aspects described herein implement a tunable transformer with capacitive tuning, one or more switched coils, and additional taps in at least one of the transformer coils. The tunable transformer architecture described herein enables the resonant frequency within RF transceiver matching networks to be adjusted without substantially impacting the output power at resonance. Thus, the aspects described herein advantageously allow a single transmitter or receiver path to cover a wider frequency range (i.e., more frequency bands) due to the matching network having an adjustable (i.e., tunable) resonant frequency. Moreover, the aspects described herein allow for the number of required transceiver paths to be reduced or minimized, which in turn allows for a decrease in die area and production costs as well as a reduction in overall design complexity of the RF chip.

The tunability of the transformer described in accordance with the various aspects herein implements a combination of two concepts. The first of these concepts is the use of an additional transformer coil compared to those used for conventional transformer designs, e.g., the insertion of a third coil that may be coupled in series with or otherwise coupled in any suitable manner to a tunable capacitance. The second of these concepts is the use of a multi-tap transformer coil within the tunable transformer architecture. Doing so allows electronic components (e.g., RF circuitry such as amplifiers, oscillators, etc., as further discussed herein) to be coupled to different transformer coil taps within the tunable transformer and thus facilitates an adjustable DC inductance. As further discussed below, with this additional degree of freedom, aspects include the transformer parameters being tuned (more) independently from one other to counteract changes in mutual inductance between the non-switched transformer coils.

FIG. 1A illustrates a circuit diagram of an exemplary tunable transformer implemented as part of a transmitter, in accordance with an aspect of the disclosure. As shown in FIG. 1A, the tunable transformer 100 has a trifilar architecture that includes three transformer coils 102, 104, 106, which may be modeled as shown using the representative ideal inductances L1, L2, and L3, respectively. Although a trifilar transformer is referenced throughout the disclosure and in the Figures, aspects may include the extension of the concepts discussed herein to a tunable transformer having any suitable number of coils, each having any suitable number of taps, and with any suitable number of which being selectively coupled or decoupled to the tunable transformer and/or to series capacitances to provide the desired tuning characteristics.

Furthermore, each of the transformer coils (e.g., 102, 104, 106) may be comprised of any suitable coil shape and/or any suitable number of windings to produce the desired inductance values in accordance with the particular resonant frequency or band of frequencies used for a particular application. For example, the transformer coils 102, 104, 106 may be implemented as a number of planar coils of conductive material within a single die or chip, as shown and discussed herein with further reference to FIG. 2. In any event, aspects include the coupling between the transformer coils 102, 104, and 106 as shown in FIG. 1A being represented by the mutual inductances $M_{12}$, $M_{13}$, and $M_{23}$.

Figure 1B:
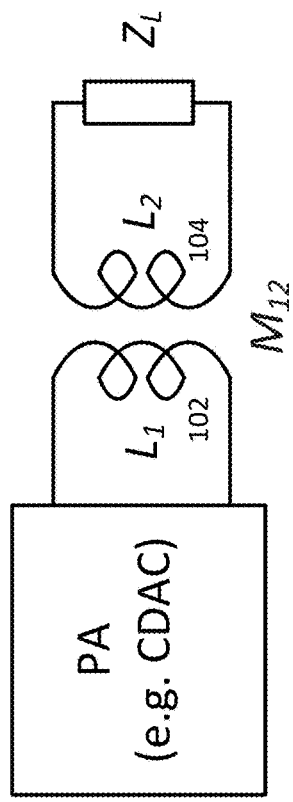
FIG. 1B illustrates a circuit diagram of an exemplary tunable transformer implemented as part of a transmitter when the switch shown in FIG. 1A is disconnected, in accordance with an aspect of the disclosure.
Figure 1C:
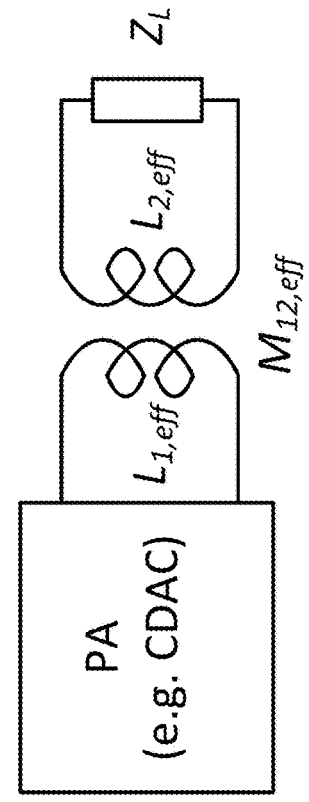
FIG. 1C illustrates a circuit diagram of an exemplary tunable transformer implemented as part of a transmitter when the switch shown in FIG. 1A is connected, in accordance with an aspect of the disclosure.

Moreover, the tunable transformer architecture shown in FIGS. 1A-1C is described herein as being coupled in a transmitter configuration by way of example and not limitation. The aspects described herein may implement the tunable transformer 100 (or, more generally, any suitable transformer architecture based upon the example tunable transformer 100 or extensions thereof) as part of any transformer-based circuit that may leverage the tuning properties as discussed herein. For example, the tunable transformer aspects described herein may be implemented as part of a matching network used within a receive and/or transmit path of a wireless radio, as an oscillator (e.g., a voltage-controller oscillator (VCO) or temperature-controlled oscillator (TCO)), a mixer, as part of any suitable type of amplifier (e.g., a multi-stage amplifier or a low-noise amplifier (LNA)), etc. Some of these additional implementations are further discussed below with respect to FIGS. 5-7.

Each transformer coil 102, 104, 106 of the tunable transformer 100 may be associated with a separate port, and thus the tunable transformer 100 in this example may be considered a three-port device. For ease of explanation, the first of these three ports may be associated with the transformer coil 102 (i.e., the "primary" transformer coil), the second port associated with the transformer coil 104 (i.e., the "secondary" transformer coil), and the third port associated with the transformer coil 106 (i.e., the "tertiary" transformer coil). In the example shown in FIG. 1A, the first port of the tunable transformer 100, i.e., the transformer coil 102, is coupled to a power amplifier (PA). As an example, the PA may be implemented as a capacitive radio frequency (RF) digital-to-analog converter (CDAC), although other implementations are possible as well, as noted herein.

The second port of the tunable transformer 100, i.e., the transformer coil 104, is coupled to a load $Z_L$. The load $Z_L$ may represent, for example, a circuit model of the impedance associated with one or more stages following the PA. To provide an example, the load $Z_L$ may represent a circuit-equivalent resistance and reactance associated with another amplifier stage, the characteristic impedance associated with a transmission line coupled to an antenna (e.g., 50 Ohms), etc.

The third port, i.e., the transformer coil 106, is shown in FIG. 1A as being coupled in series with a capacitance (C) 108 via a single switch 110. In an aspect, and as further discussed below, the capacitive value associated with the capacitance 108 may be dynamically adjusted to tune the tunable transformer 100 and to adapt to changes in communication frequencies at various points in time.

The switch 110 and the capacitance 108 shown in FIG. 1A are simplified for purposes of brevity, with a single switch 110 and a single capacitance 108 being shown for ease of explanation and not by way of limitation. In particular, various aspects include the third transformer coil 106 being coupled to any suitable number of switches and/or capacitances. Thus, although the switch 110 and the capacitance 108 are referred to herein in the singular, it will be understood that either (or both) of these components may be one of several, depending upon the particular implementation. For example, the capacitance 108 shown in FIG. 1A may be implemented as any suitable number and/or type of capacitive elements, which may be integrated as part of the same chip or die associated with the other components of the tunable transformer 100.

For example, the capacitance 108 may represent an overall capacitance associated with any suitable number of capacitive elements. To provide an illustrative example, FIG. 1A illustrates a "switchable capacitor bank" configuration 170. In this implementation, the combination of the switch 110 and the capacitance 108 shown in FIG. 1A may represent one of several switch/capacitance combinations within a capacitor bank, with each switch/capacitance combination being connected in parallel with one another. In this example, the overall capacitance coupled to the third transformer coil may be adjusted by controlling the state of specific switches within the capacitor bank (i.e., coupling some while decoupling others using electronic control signals), thereby yielding different combinations of connected capacitances within the capacitor bank and producing different capacitive values for the different combinations.

To provide another illustrative example, FIG. 1A also illustrates a symmetric switchable capacitor bank configuration 180. This implementation also utilizes a bank of switched capacitors having electronically controlled (e.g., via control signals) switches, similar to the configuration 170. However, the capacitor bank configuration 180 utilizes a symmetric switch configuration, which allows each capacitor within the bank to be isolated from the rest of the tunable circuit (and, in particular, the transformer coil 106) when the switches on each side of a respective capacitor are both open. This may be particularly useful, for instance, when additional circuit isolation is desired and/or to reduce the parasitic capacitance that may otherwise be caused when one node of each capacitor in the capacitor bank remains coupled to the transformer coil 106, as is the case for the capacitor bank configuration 170.

To provide another illustrative example, FIG. 1A also illustrates a "varactor" (voltage dependent capacitor) configuration 190. In this implementation, the switch 110 and the capacitance 108 shown in FIG. 1A may be replaced with one or more capacitive elements having capacitive values that are electronically adjusted via one or more electronic control signals (e.g., varactors).

In various aspects, the circuit equivalent capacitance 108 shown in FIG. 1A may include any number of capacitors that are coupled to one another and/or the third transformer coil 106 in any suitable configuration. The capacitors may be fixed, variable (e.g., electronically adjusted), or a combination thereof, and may thus provide a desired capacitance for the particular frequency or range of frequencies used.

Regardless of how the capacitance 108 is tuned and/or controlled, aspects include the state of the switch 110 (which may be one of several as noted above when used as part of a switchable capacitor bank) being configured to disconnect the third transformer coil 106 from the tunable transformer 100. For example, the switch 110 may be implemented in series with the voltage dependent capacitor configuration (not shown in FIG. 1A), and thus may be opened to decouple the third transformer coil 106 from the tunable transformer 100. As another example, if a switched capacitor bank is used, each of the switches may be opened such that none of the capacitances are coupled to the third transformer coil 106, effectively decoupling the third transformer coil 106 from the tunable transformer 100. Of course, in some implementations the third transformer coil 106 need not be selectively decoupled from the tunable transformer 100, and thus switches for this purpose may be omitted if only capacitive tuning and/or multi-tap tuning (as discussed further below) are needed.

To control the switch state, aspects include the switch 110 being implemented as any suitable type of component configured to allow selective coupling and decoupling of the transformer coil 106 with one or more capacitances as noted above. For example, the switch 110 may be electronically controlled via one or more control signals, and may be implemented as any suitable type of component that may be controlled in this manner, e.g., a transistor element, a relay, etc.

In an aspect, by controlling the state of the switch, the equivalent inductances between the first port and the second port, as well as the mutual inductance $M_{12}$ between the transformer coils 102 and 104, may be adjusted. Furthermore, aspects include more than two tunable states being realized by adjusting the capacitance 108 at the third port 106 in different ways, as noted above. Again, the coupling between the coils 102, 104, and 106 as shown in FIG. 1A may be represented by the mutual inductances $M_{12}$, $M_{13}$, and $M_{23}$. The notation used for the mutual inductive coupling may thus be expressed in the form $M_{i,j}$, in which the mutual inductance $M_{i,j}$ represents the mutual inductance between the transformer coils associated with each modeled inductance $L_i$ and $L_j$.

The transformer coil coupling associated with the tunable transformer 100 as shown in FIG. 1A may be described in terms of the following Equations 1-3. Specifically, when the tunable transformer 100 is modeled using three ideal inductances for each respective transformer coil 102, 104, 106, the tunable transformer 100 may be described using the following three-port equations 1-3:

$$V_1 = j\omega L_1 I_1 + j\omega M_{12} I_2 + j\omega M_{13} I_3 \qquad \text{Eqn. 1}$$

$$V_2 = j\omega M_{12} I_1 + j\omega L_2 I_2 + j\omega M_{23} I_3 \qquad \text{Eqn. 2}$$

$$V_3 = j\omega M_{13} I_1 + j\omega M_{23} I_2 + j\omega L_3 I_3 \qquad \text{Eqn. 3}$$

With reference to Equations 1-3 above, the complex voltage across each coil i (i.e., 102=1, 104=2, 106=3) is labeled $V_i$, and the complex current flowing through each respective transformer coil is $I_i$. $\omega$ represents the angular frequency, and j the imaginary unit.

FIG. 1B illustrates a circuit diagram of an exemplary tunable transformer implemented as part of a transmitter when the switch shown in FIG. 1A is disconnected, in accordance with an aspect of the disclosure. In particular, when the switch 110 is open, the third transformer coil 106 has no influence on the other two ports, and can be neglected. On the other hand, FIG. 1C illustrates a circuit diagram of an exemplary tunable transformer implemented as part of a transmitter when the switch shown in FIG. 1A is connected, in accordance with an aspect of the disclosure. In the conducting case shown in FIG. 1C, the coupling effect between $L_3$ and the other transformer coils ($L_1$, $L_2$) can be described by replacing $L_1$, $L_2$, and $M_{12}$ by effective values $L_{1,eff}$, $L_{2,eff}$, and $M_{12,eff}$.

In an aspect, additional equations for the effective values above may be derived using a first approximation in accordance with the circuit model as shown in FIG. 1A, which are provided below. In particular, the Equations 4-6 are derived from the Equations 1-3 as discussed above in accordance with the circuit model as shown in FIG. 1A:

$$L_{1,eff} = L_1 + \omega^2 C M_{13}^2 / 1 - \omega^2 C L_3 \qquad \text{Eqn. 4}$$

$$L_{2,eff} = L_2 + \frac{\omega^2 C M_{23}^2}{1 - \omega^2 C L_3} \qquad \text{Eqn. 5}$$

$$M_{12,eff} = M_{12} + \frac{\omega^2 C M_{13}^2 M_{23}}{1 - \omega^2 C L_3} \qquad \text{Eqn. 6}$$

For simplicity and ease of explanation, the Equations 4-6 above assume that the switch 110 is ideal (i.e., has no parasitic resistance or capacitance), and that the capacitance at the third port has the value C. $\omega$ once again represents the angular frequency.

Equations 4-6 therefore reveal that the effective inductances $L_{i,eff}$ and $M_{ij,eff}$ (i,j=1, 2, 3, . . . , n; with n depending on the total number of transformer coils, 3 in this example) are either increased $$\left(\omega < \frac{1}{\sqrt{CL_3}}\right)$$

or decreased $$\left(\omega > \frac{1}{\sqrt{CL_3}}\right)$$

when the switch 110 is closed. For example, the second term in the equation for $L_{1,eff}$ is positive for $$\omega < \frac{1}{\sqrt{CL_3}}.$$

And, because this term is added to $L_1$ (the first term), the result is larger than $L_1$ in this frequency range. The magnitude of the change, however, may be influenced by C and $L_3$.

Figure 2:
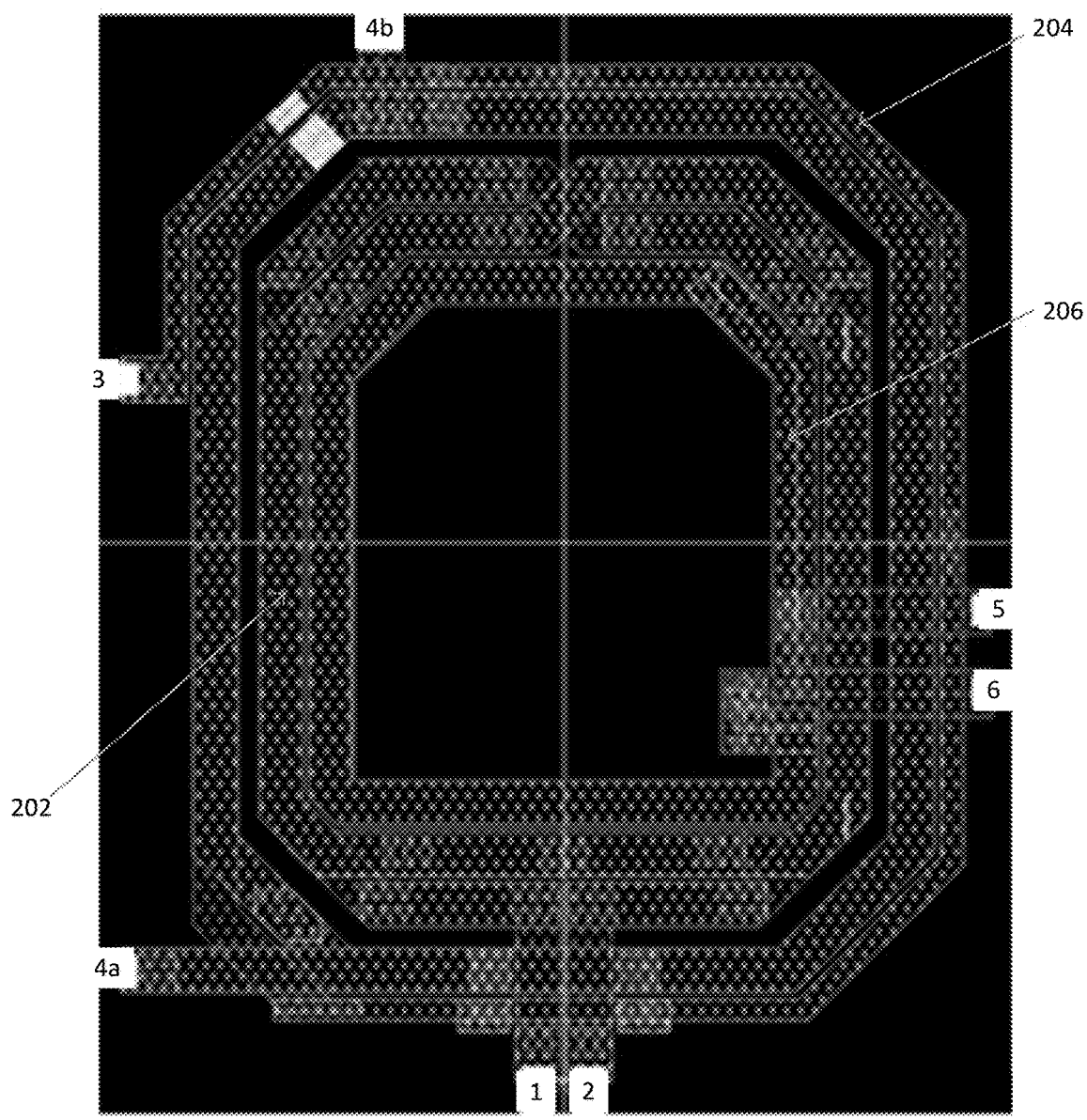
FIG. 2 illustrates a layout of an exemplary tunable transformer, in accordance with an aspect of the disclosure.

FIG. 2 illustrates a layout of an exemplary tunable transformer, in accordance with an aspect of the disclosure. As shown in FIG. 2, an example layout of a tunable transformer 200 shows three transformer coils 202, 204, and 206, which may be identified with, for instance, the transformer coils 102, 104, 106 as shown in FIG. 1A. The example layout shown in FIG. 2 includes a set of substantially concentric transformer coils, which may be substantially co-planar with one another. Of course, although substantially co-planar in this example, the transformer coils 202, 204, 206 (or portions thereof) may occupy different layers of a circuit board, chip, or die, for example, depending upon the particular application or to prevent the coils from short circuiting to other adjacent coil paths. Again, the size and shape of the individual transformer coils 202, 204, 206 as shown in FIG. 2 is by way of example and not limitation. As shown in FIG. 2, an advantage of this layout is that given the planar geometry of the tunable transformer 200, the addition of the third transformer coil 206 does not increase the overall area of the transformer, as this occupies unused space in a region inside the first transformer coil 202.

In an aspect, each of the transformer coils 202, 204, 206 is identified with at least one pair of taps that may be coupled to pins or other suitable coupling means to facilitate the connection of particular electronic components to each transformer coil. For example, the pairs of pins 1-2, 3-4a, and 5-6 are associated with the transformer coils 202, 204, and 206, respectively. As further discussed herein, one or more of the transformer coils (e.g., the transformer coil 204 in this example) may have an additional tap as indicated by the pin 4b, such that the pair of pins 3-4b may alternatively be associated with the transformer coil 204. This allows the transformer coil 204 to provide different inductance values depending upon which of the pin pairs (i.e., 3-4a or 3-4b) are selectively coupled to a particular component.

Figure 3A:
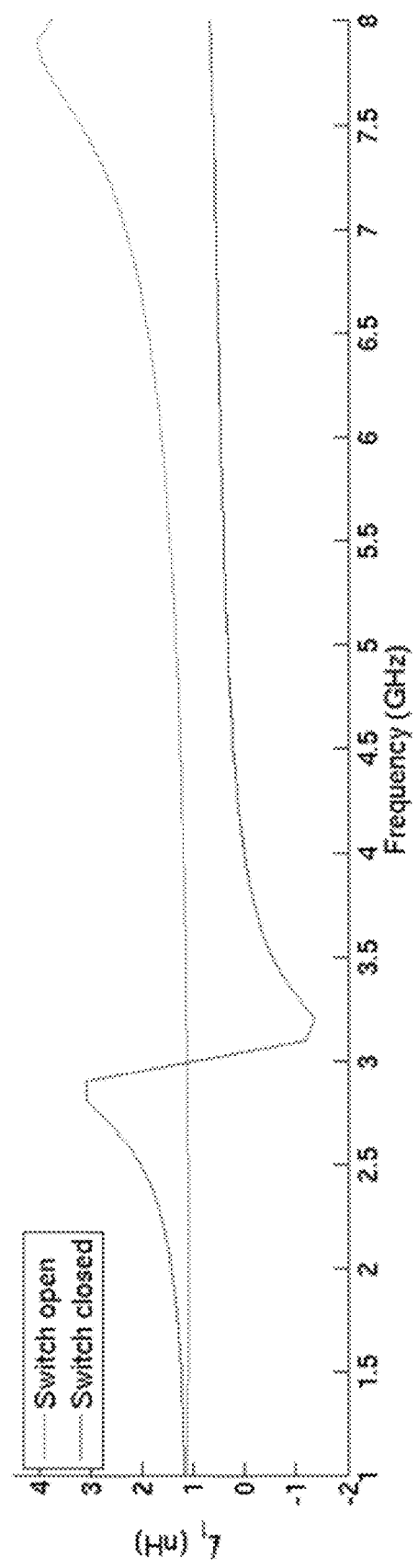
FIG. 3A is an inductance versus frequency graph associated with the first transformer coil $L_1$ as shown in FIG. 1A, in accordance with an aspect of the disclosure.
Figure 3B:
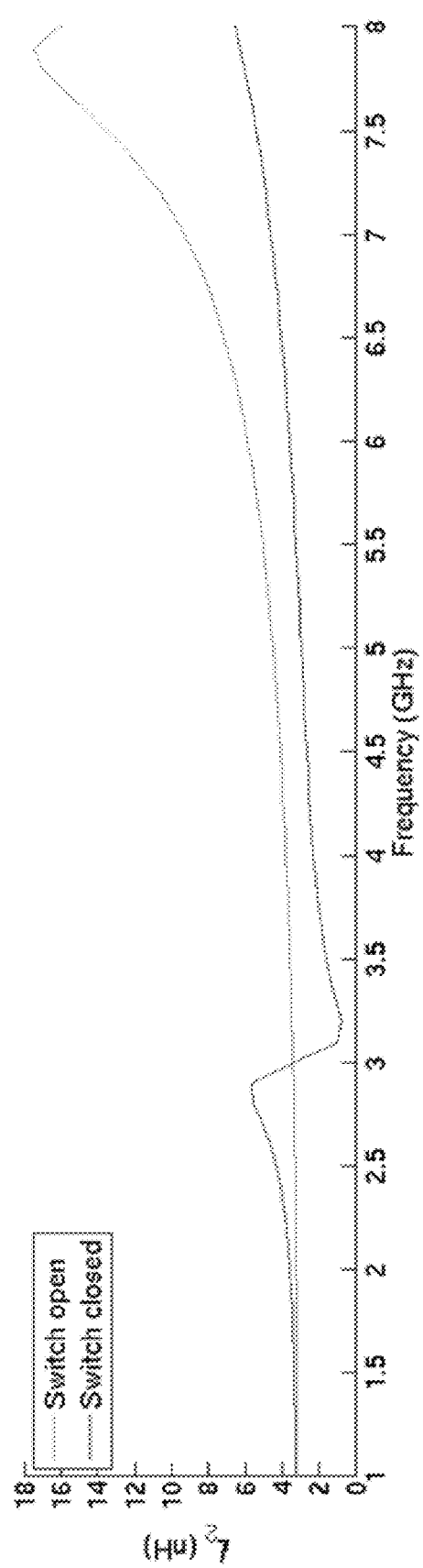
FIG. 3B is an inductance versus frequency graph associated with the second transformer coil $L_2$ as shown in FIG. 1A, in accordance with an aspect of the disclosure.
Figure 3C:
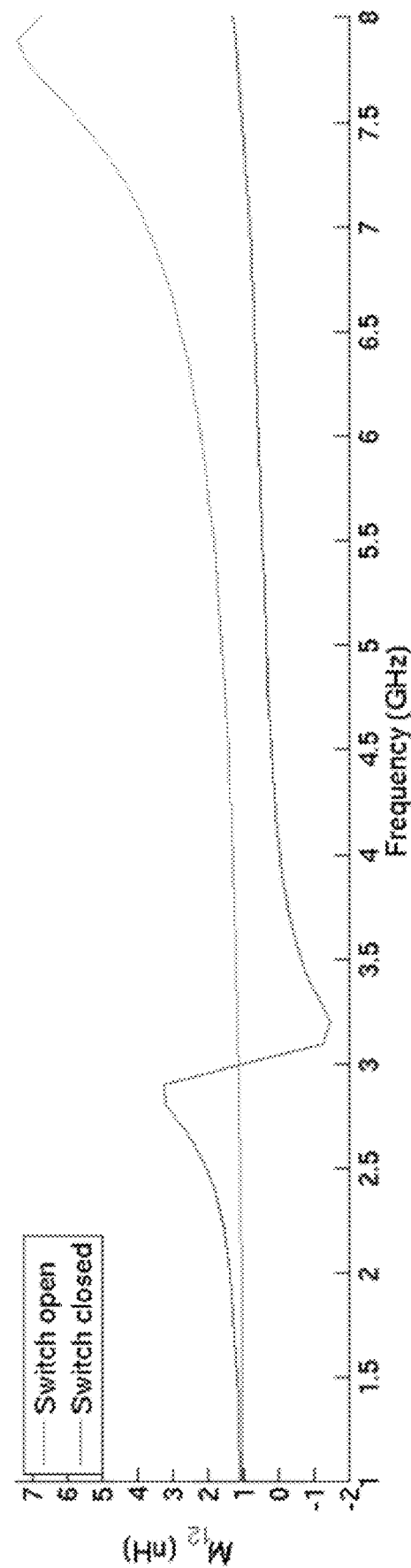
FIG. 3C is an inductance versus frequency graph associated with the mutual inductance $M_{12}$ between the two transformer coils $L_1$ and $L_2$ as shown in FIG. 1A, in accordance with an aspect of the disclosure.

For ease of explanation, FIGS. 3A-C illustrate simulated values of the inductances for both switching states of the switch 110, as shown in FIG. 1A, plotted against the frequency. Although the switch 110 is not shown in FIG. 2 for purposes of brevity, FIGS. 3A-3C illustrate the simulated inductance values of the transformer as shown in FIG. 2 for both switching states. With reference to FIGS. 1A and 2, for the plots shown in FIGS. 3A-3C, the DC value of the third transformer coil 106/206 ($L_3$) is 1 nH, and the value of the capacitance 108 is 2.9 pF. For these values, the resonant frequency of the $L_3C$ tank $$\left(\frac{1}{2\pi\sqrt{CL_3}}\right)$$

is about 2.90 GHz. Moreover, and as further discussed below, the simulated inductance value $L_2$ of the second transformer coil 104/204 as shown in FIG. 3B is measured with respect to a pin configuration using pins 3-4a, as shown in FIG. 2.

As the third transformer coil 106/206 is selectively coupled to the first and the second transformer coils 102/202, 104/204, the overall tuning characteristics of the tunable transformer 100/200 are also impacted. In particular, the input or primary inductance to the tunable transformer 100/200 may be denoted as $L_{in}$, which may be considered an equivalent input inductance as "seen" by the primary side of the tunable transformer 100/200 (i.e., as "seen" by the PA as shown in FIG. 1A). With reference to FIG. 1B, the input inductance $L_{in}$ is proportional to the inductance $L_1$ of the first transformer coil 102, and thus the change of the inductance $L_{in}$ shifts the frequency of the matching network implementing the tunable transformer 100. In contrast, and with continued reference to FIG. 1B, the change of the second inductance $L_2$ associated with the second transformer coil 104, and the mutual inductance $M_{12}$, reduce the change of $L_{in}$ caused by $L_1$, and additionally results in an alteration of power that is delivered to the load $Z_L$ at the resonant frequency (which may be undesirable). Additionally, the parasitic resistance of the third transformer coil 106 and the switch 110 further reduce the output power.

The term "resonant frequency" in this context is the resonant frequency as measured across the load $Z_L$, which is associated with the output power delivered by the PA as a result of the inductive coupling via the mutual inductance $M_{12}$. In other configurations, however, the resonant frequency may be associated with the "output" of the tunable transformer regardless of the particular implementation.

Therefore, to achieve a stronger shift of the resonant frequency without changing the power at resonance, aspects include selectively increasing or decreasing the inductance $L_2$ of the second transformer coil 102/202 based upon a set of conditions. In particular, and turning now to FIG. 1C, the inductance $L_2$ of the second transformer coil 104 may be increased when $L_{2,eff}<L_2$. Moreover, the inductance $L_2$ of the second transformer coil 104 may be decreased when $L_{2,eff}>L_2$. To do so, aspects include using the multi-tap architecture as shown and discussed above with reference to FIG. 2, for example, to selectively adjust the inductance $L_2$ of the second transformer coil 104/204 in response to closing the switch 110.

Advantageously, the adjustment of the inductance $L_2$ also counteracts the change in the mutual inductance $M_{12}$, as the mutual inductance is proportional to the inductance $L_2$ as represented by the approximation $M_{12} \sim \sqrt{L_2}$. With reference to FIGS. 1A-1C and FIG. 2, aspects include realizing the adjustment of the inductance $L_2$ by selecting which taps of the second transformer coil 104/204 are coupled to the load $Z_L$, which may represent in this example the other component(s) to which the tunable transformer 100 is coupled in a particular configuration. In other words, when signal traces at the second port are connected to different taps of the second transformer coil 104/204, the inductance "seen" by components coupled at the secondary transformer coil side changes. To provide an illustrative example with reference to FIGS. 1A-1C and FIG. 2, the DC value of the second transformer coil 104/204 may be switched between 3.4 nH (when pins 3-4a are connected to the load $Z_L$), and 2 nH (when pins 3-4b are connected to the load $Z_L$).

In various aspects, the selective coupling of specific taps of the second transformer coil 104/204 and the components represented by the load $Z_L$ may be implemented using any suitable type and number of switching elements. For example, the second transformer coil 104/204 (as well as any of the other transformer coils) of the tunable transformer 100 may have one or more switching elements coupled to one or more of the transformer coil taps that are switched in this manner. For instance, although not shown in the Figures for purposes of brevity, each of the transformer coils implementing multiple switched taps may be coupled to its respective component via its respective switching element. The switching elements may include, for instance, electronically-controlled switches, transistors, etc.

To provide an illustrative example with respect to FIGS. 1A and 2, the component associated with the load $Z_L$ as shown in FIG. 1A may be coupled to the second transformer coil 104 via a switching block 150. The switching block 150 may represent any suitable number and/or type of electronically-controlled switching elements (e.g., transistors, relays, etc.) having switching states controlled in response to one or more received control signals (not shown). The switching block 150 may thus selectively couple one of several different tap combinations (e.g., pins 3-4a or pins 3-4b, as shown in FIG. 2) to the component associated with the load $Z_L$.

Figure 4A:
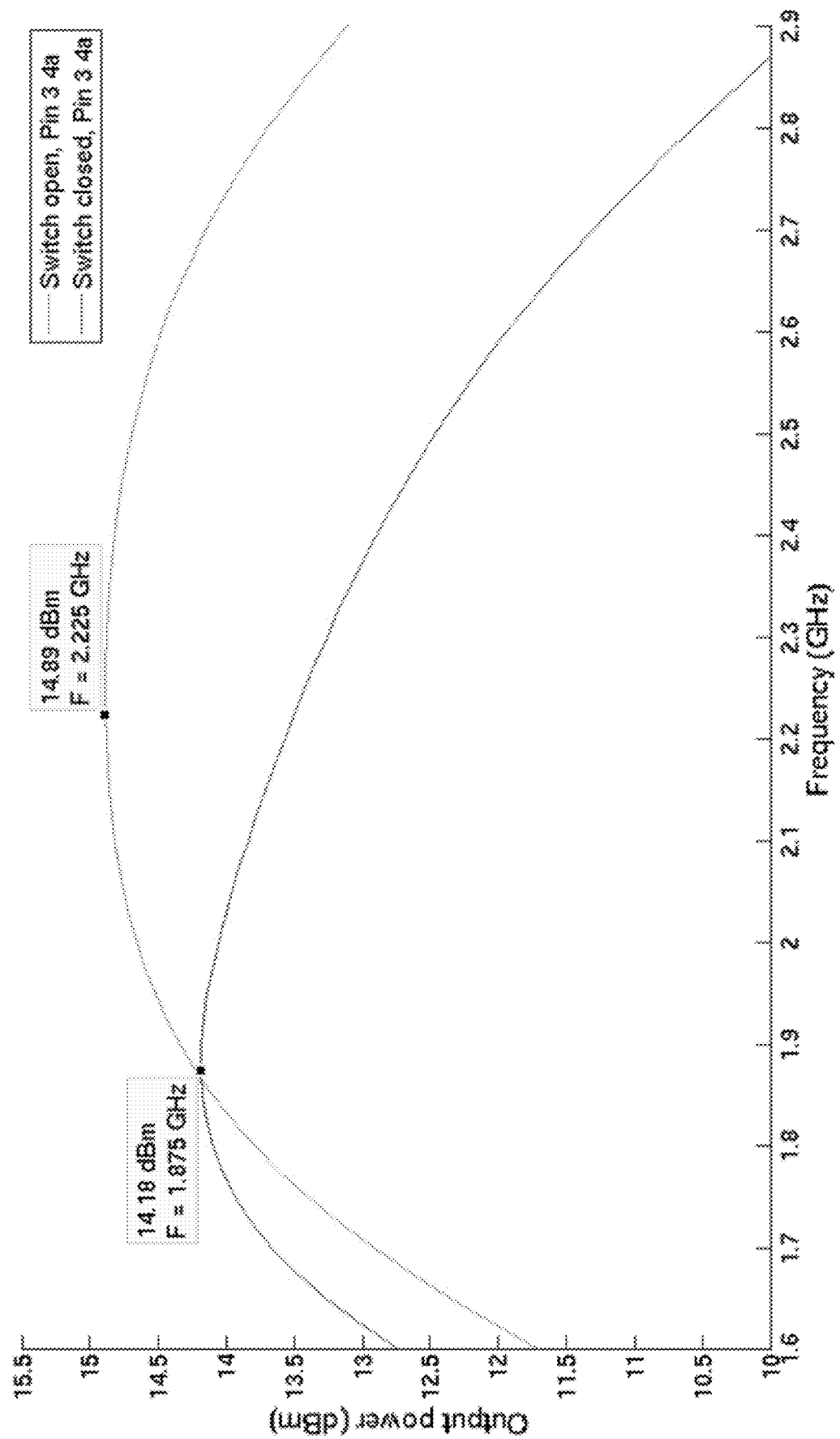
FIGS. 4A-4C are output power curves of an example transmitter implementing a tunable transformer in various switching states and tap configurations, in accordance with an aspect of the disclosure.
Figure 4B:
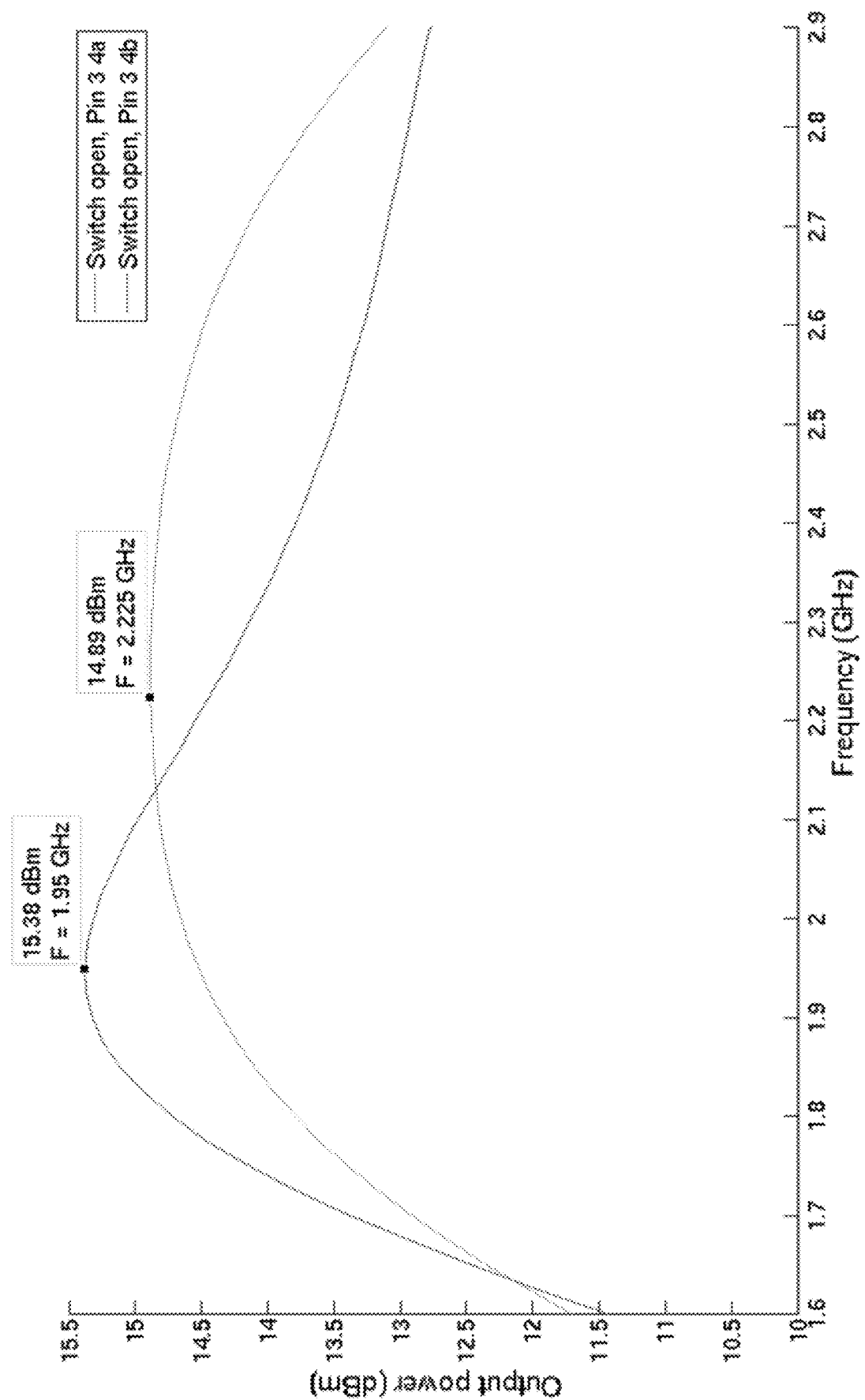
Figure 4C:
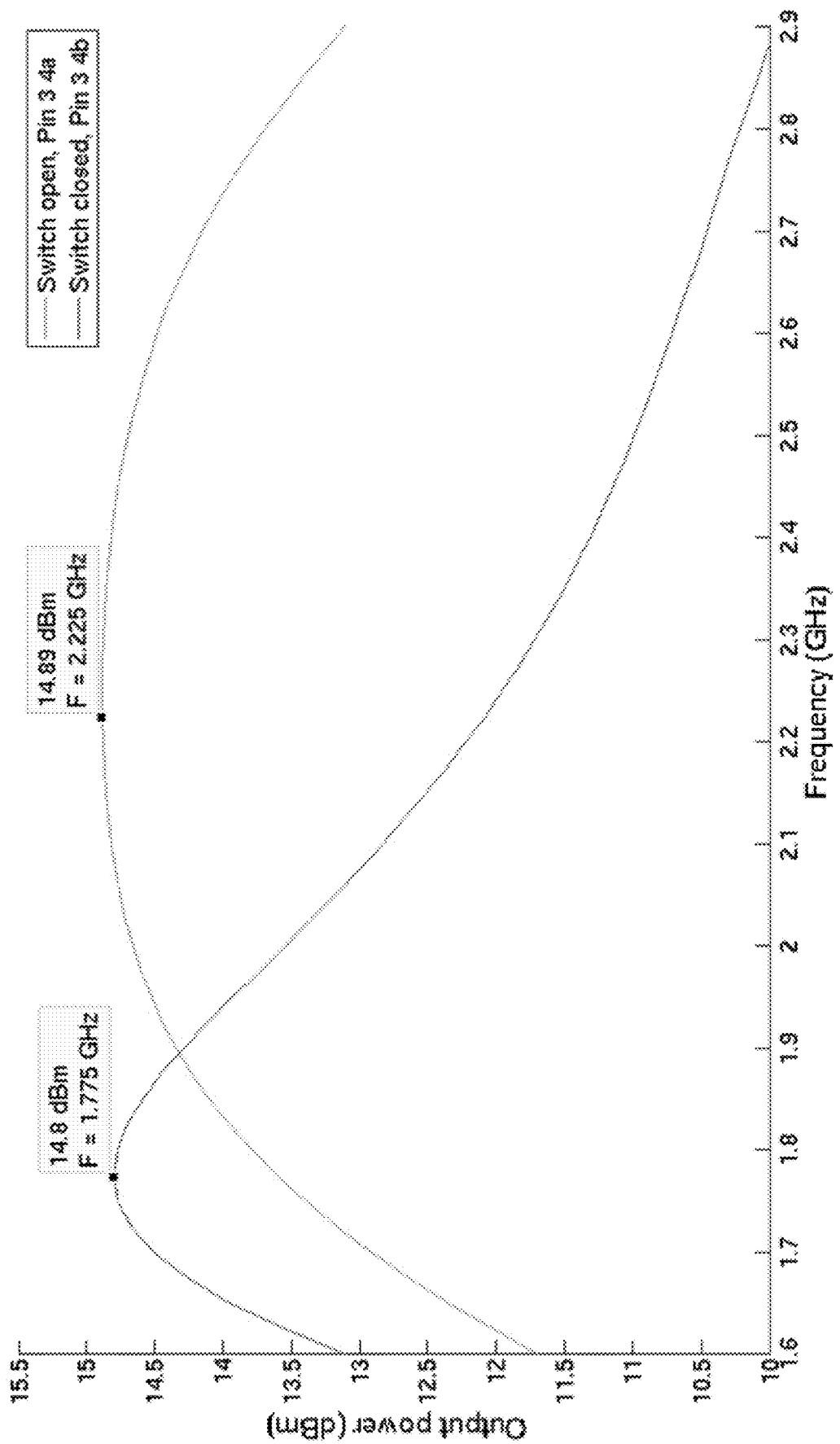

FIGS. 4A-C are output power curves of an example transmitter implementing a tunable transformer in various switching states and tap configurations, in accordance with an aspect of the disclosure. The output power curves shown in FIGS. 4A-4C illustrate how both the aforementioned concepts can be combined to cancel unwanted changes of the power level at resonance. In particular, the output power curves shown in FIGS. 4A-4C represent changes in output power of a transmit signal (e.g., a signal generated via the PA that forms part of a transmit chain) at the load $Z_L$ (in dBm) over frequency. In other words, the changes in output power may be considered a function of the impedance matching performed by the tunable transformer 100, with the adjusted impedance matching resulting in an increased efficiency that is reflected in the increased output power level. The example power curves shown in FIGS. 4A-4C are simulations with respect to an example transmitter having the structure as shown in FIG. 1A, and are provided for ease of explanation. The parasitic resistance and capacitance of the switch 110 are also considered in this simulation to provide a realistic and accurate depiction of the implementation of the tunable transformer 100 as part of an amplifier circuit.

The power curves in FIGS. 4A-4C show the results of different combinations of the third transformer coil 106 being coupled via closure of the switch 110 and the use of each different taps to couple the second transformer coil 104 to the load $Z_L$. For instance, FIG. 4A includes two different output power curves. One of these output power curves corresponds to the open state of the switch 110, in which the third transformer coil 106 is decoupled from the other two transformer coils 102, 104, and the second transformer coil 104 is coupled to the load $Z_L$ via pins 3-4a as shown in FIG. 2. The second of these output power curves corresponds to the closed state of the switch 110, in which the third transformer coil 106 is coupled to the other two transformer coils 102, 104, and the second transformer coil 104 is coupled to the load $Z_L$ via pins 3-4a as shown in FIG. 2. As can be seen from FIG. 4A, coupling the third transformer coil 106 by closing the switch 110 shifts the resonant frequency to 1.875 GHz, but as a result also decreases the output power at resonance from 14.89 dBm to 14.18 dBm.

FIG. 4B also includes two different output power curves. One of these output power curves corresponds to the open state of the switch 110, in which the third transformer coil 106 is decoupled from the other two transformer coils 102, 104, and the second transformer coil 104 is coupled to the load $Z_L$ via pins 3-4a as shown in FIG. 2. The second of these output power curves also corresponds to the open state of the switch 110, in which the third transformer coil 106 is decoupled to the other two transformer coils 102, 104, but in this case the second transformer coil 104 is coupled to the load $Z_L$ via pins 3-4b as shown in FIG. 2. FIG. 4B thus demonstrates the effect on the tunable transformer resonant frequency and output power attributed solely via the change in inductance of the second transformer coil 104 as a result of the different taps being selected (i.e., with the third transformer coil 106 being decoupled in each case as a result of the open switch 110).

FIG. 4C includes two different output power curves as well. One of these output power curves corresponds to the open state of the switch 110, in which the third transformer coil 106 is decoupled from the other two transformer coils 102, 104, and the second transformer coil 104 is coupled to the load $Z_L$ via pins 3-4a as shown in FIG. 2. The second of these output power curves corresponds to the closed state of the switch 110, in which the third transformer coil 106 is coupled to the other two transformer coils 102, 104, and the second transformer coil 104 is coupled to the load $Z_L$ via pins 3-4b as shown in FIG. 2. The "switch closed" traces from FIGS. 4A and 4C can be compared. From this comparison, it is noted that both traces correspond to the third transformer coil 106 being coupled via the closed switch 110. However, it is shown from FIG. 4C that the reduction in power when the resonance is shifted via the coupling of the third transformer coil 106 is largely compensated by changing the inductance of the transformer coil 104 via the selection of a different set of taps (e.g., 14.18 dBm at 1.875 GHz vs. 14.8 dBm at 1.775 GHz).

As can be observed from the output power curves in FIGS. 4A-4C, the effective inductance values $L_{1,eff}$, $L_{2,eff}$, and $M_{12,eff}$ are increased as a result of the third transformer coil 100 being coupled via the closed switch 110. This results in a decrease in the resonant frequency, and the power level is reduced. Furthermore, it is shown in FIG. 4B that the inductance $L_2$ is reduced by alternating the pins that are coupled to the load $Z_L$, while the switch is open, which results in a lower resonant frequency but a higher output power level. From FIG. 4C it is shown that when $L_2$ is decreased and the switch is closed, the output power at resonance remains nearly constant, and the spectral distance between the resonant frequencies associated with each respective power curve is increased. In other words, the increase in the effective inductance values $L_{2,eff}$ and $M_{12,eff}$ may be substantially or entirely compensated by adjusting the inductance of the second transformer coil 104 via the tap pin reconfiguration from pins 3-4a to pins 3-4b. Of course, in some instances the power offsets may be of a lesser magnitude, and thus these shifts may be compensated by adjusting the capacitance coupled to the third transformer coil 106 without changing the tap configuration of the second transformer coil 104.

In various aspects, the tunable transformer 100 may be designed in various ways. For example, using the example architecture and setup shown in FIG. 1A, a design approach may include setting the pole frequency of the loaded transformer $$\frac{R_L}{L_2}$$

within range of the resonant frequency of the matching network. In this example, $R_L$ may be considered the resistance terminating the second transformer coil 104 output. As another example, a new optimization of the transmitter parameters (e.g., the values of capacitances in the CDAC or other components, as the case may be) may also be utilized to additionally or alternatively facilitate the desired tuning results when the tunable transformer 100 is implemented as part of a circuit design.

Figure 5:
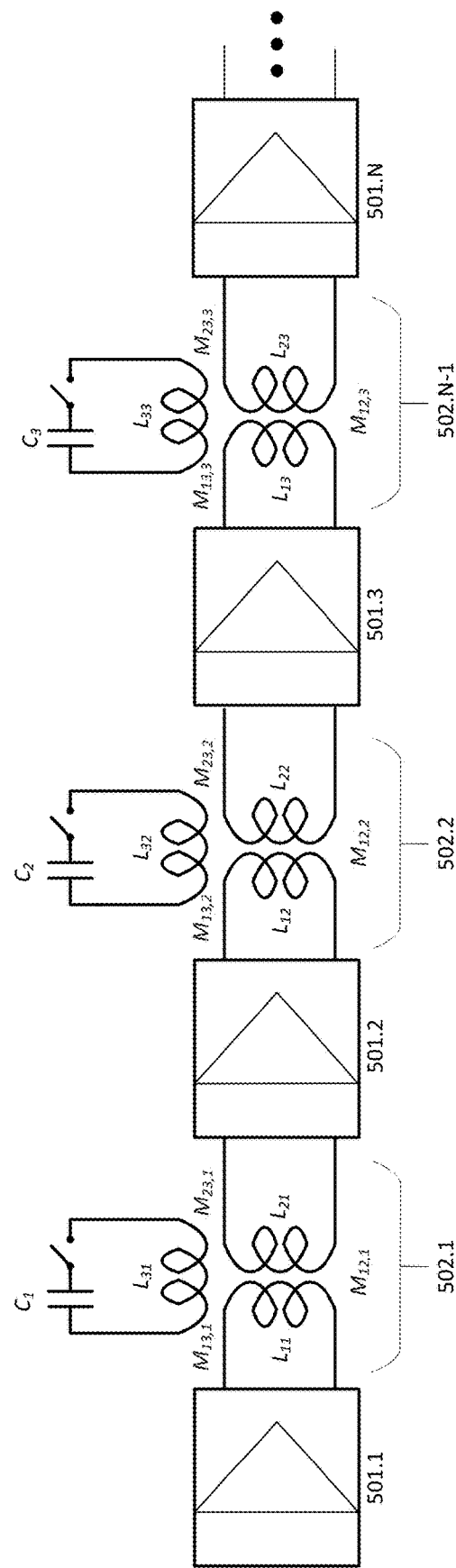
FIG. 5 illustrates a circuit diagram of an example multi-stage amplifier implementing a tunable transformer, in accordance with an aspect of the disclosure.

Again, the architecture associated with the tunable transformer 100 as discussed herein is not limited to examples shown in FIGS. 1A-1C, in which the tunable transformer 100 is coupled to the output of a PA within a transmit chain. For example, FIG. 5 illustrates a circuit diagram of an example multi-stage amplifier implementing a tunable transformer, in accordance with an aspect of the disclosure. The multistage amplifier shown in FIG. 5 may be implemented within any suitable radio design, such as part of a transmit chain, for instance.

As shown in FIG. 5, the multistage amplifier includes any suitable number N of power amplifiers 501.1-501.N. One or more of the amplifiers 501.1-501.N may have a similar architecture as the PA as shown and discussed in FIGS. 1A-1C, for example, (e.g., a CDAC architecture). To implement impedance matching between each of the amplifiers 501.1-501.N, each of the amplifiers 501.1-501.N within the multistage amplifier 500 may be coupled to one another via a respective tunable transformer 502.1-502.N-1. Thus, the input impedance and output impedance with respect to each of the amplifiers 501.1-501.N within the multistage amplifier 500 may be adjusted via each intervening tunable transformer 502.1-502.1-N.

In this example, each tunable transformer 502.1-502.N-1 may be identical or have differing values with respect to the transformer coil inductances L and/or the tunable capacitance values C. Moreover, each respective tunable transformer 502.1-502.N-1 may be tuned individually in a manner as discussed above with respect to the tunable transformer 100 as shown in FIGS. 1A-1C. For example, the switching state of each switch associated with each respective tunable transformer 502.1-502.N-1 may be controlled independently of one another via a suitable control signal. Similarly, the tap coupling at the output of each respective tunable transformer 502.1-502.N-1 (e.g., $L_{21}$, $L_{22}$, and $L_{23}$) may be independently controlled via a separate suitable control signal. In this way, each individual tunable transformer 502.1-502.N-1 may be tuned independently of one another in a dynamic fashion depending upon the particular resonant frequency, matching characteristics, and power output desired at the output of each amplifier 502.1-502.N.

Figure 6:
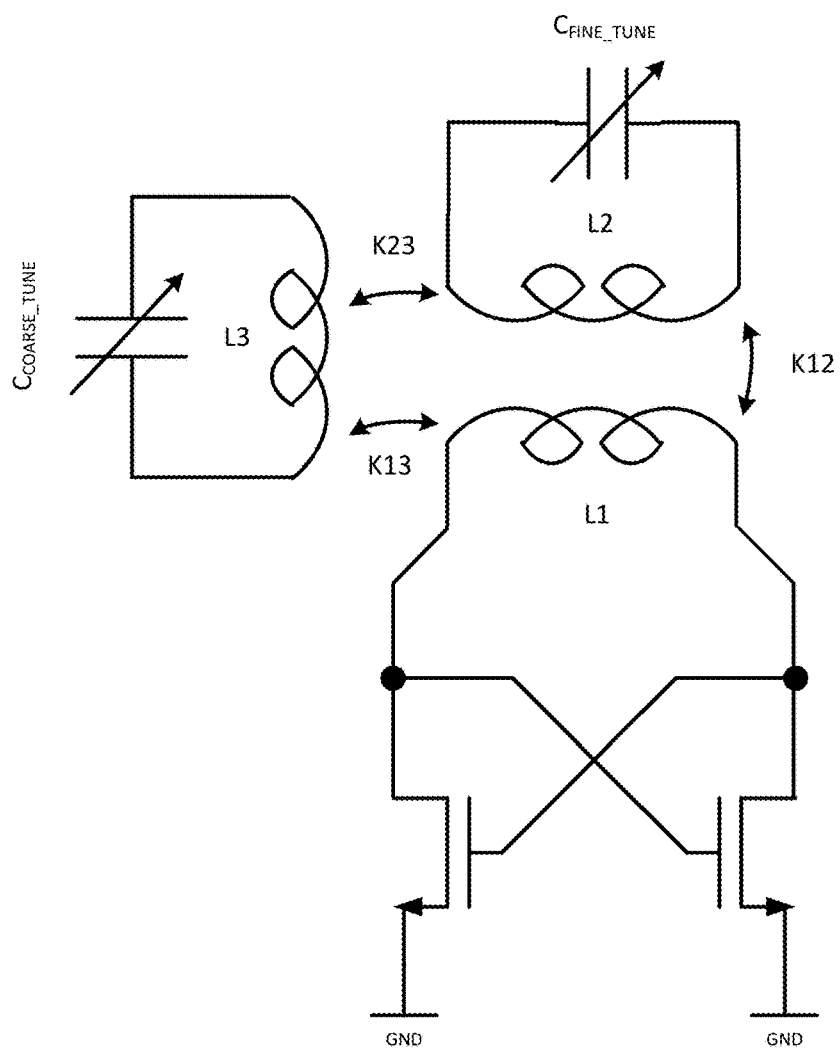
FIG. 6 illustrates a circuit diagram of an example oscillator based upon a tunable transformer, in accordance with an aspect of the disclosure.

As another example, FIG. 6 illustrates a circuit diagram of an example oscillator based upon a tunable transformer, in accordance with an aspect of the disclosure. In the transformer-based oscillator 600 as shown in FIG. 6, the magnetic coupling may be expressed by means of the coupling factors k in accordance with Equations 7-9 as follows:

$$k_{12} = \frac{M_{12}}{\sqrt{L_1 L_2}} \qquad \text{Eqn. 7}$$

$$k_{13} = \frac{M_{13}}{\sqrt{L_1 L_3}} \qquad \text{Eqn. 8}$$

$$k_{23} = \frac{M_{23}}{\sqrt{L_2 L_3}}. \qquad \text{Eqn. 9}$$

For the transformer-based oscillator 600, the tunable transformer 100 as shown in FIG. 1A may be further modified to provide an oscillating signal output across the transformer coil associated with the inductance L1 (e.g., at each transistor gate). Continuing this example, the trifilar transformer as shown in FIG. 1A may be modified such that the second transformer coil 104 associated with the inductance L2 is coupled to a fine tuning capacitance that may be electronically controlled, as opposed to the load $Z_L$ as shown in FIG. 1A. Finally, the third transformer coil 106 associated with the inductance L3 may be implemented in a similar manner as that shown in FIG. 1A, although in this implementation it may provide for an electronically-controlled capacitance to facilitate coarse tuning.

Although tap switching and series switching of the fine and coarse capacitances are not shown in FIG. 6 for purposes of brevity, aspects include these tuning components being present depending upon the particular tuning implementation desired (e.g., capacitor bank versus varactor). Moreover, the fine and/or coarse tuning capacitances as shown in FIG. 6 may optionally include series switches to selectively couple and decouple the transformer coils associated with the inductance $L_2$ and/or $L_3$, and/or to change the taps of the transformer coils associated with the inductance $L_1$, $L_2$ and/or $L_3$, for example. In this way, the resonant frequency of the transformer-based oscillator 600 may be tuned and stabilized over a wide range of frequencies.

Figure 7:
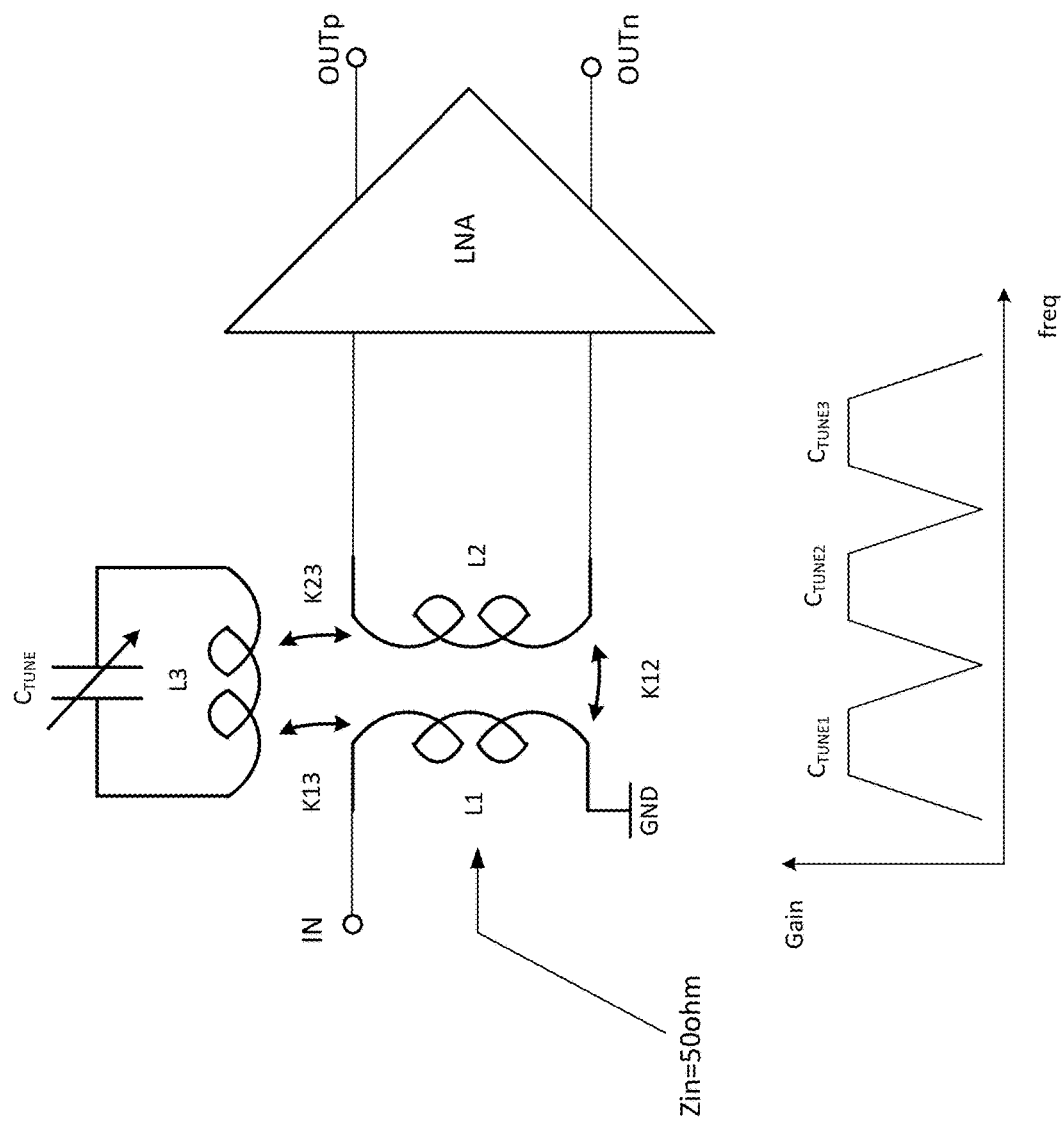
FIG. 7 illustrates a circuit diagram of an example low-noise amplifier (LNA) input based upon a tunable transformer, in accordance with an aspect of the disclosure.

FIG. 7 illustrates a circuit diagram of an example low-noise amplifier (LNA) input based upon a tunable transformer, in accordance with an aspect of the disclosure. The example shown in FIG. 7 may be implemented, for example, as part of a receive chain within a wireless radio. From FIG. 7, the magnetic coupling may be expressed by means of the coupling factors k in accordance with Equations 10-12 as follows:

$$k_{12} = \frac{M_{12}}{\sqrt{L_1 L_2}} \qquad \text{Eqn. 10}$$

$$k_{13} = \frac{M_{13}}{\sqrt{L_1 L_3}} \qquad \text{Eqn. 11}$$

$$k_{23} = \frac{M_{23}}{\sqrt{L_2 L_3}}. \qquad \text{Eqn. 12}$$

The transformer-based LNA input 700 as shown in FIG. 7 may be implemented by modifying the architecture of the tunable transformer 100 to couple a receive path or receive chain (e.g., a transmission line) associated with a receive antenna to the primary transformer coil 102 associated with the inductance $L_1$. In the example shown in FIG. 7, the input to the tunable transformer is associated with an input impedance of 50 Ohms, which may represent the characteristic impedance of a transmission line associated with a receive antenna, for instance. Continuing this example, the tunable transformer as shown in FIG. 1A may be further modified such that the second transformer coil 102 is coupled to an LNA input, as opposed to the load $Z_L$ shown in FIG. 1A. Finally, the third transformer coil 106 may be implemented in a similar manner as that shown in FIG. 1A, although in this implementation it may provide for an electronically-controlled capacitance to facilitate tuning for impedance matching to the LNA. Again, although tap switching and series switching of the tuning capacitance are not shown in FIG. 7 for purposes of brevity, aspects include these tuning components being present to selectively couple and decouple the tuning capacitance, to provide capacitive tuning, and/or to change the tap couplings of one or more of the transformer coils (e.g., the taps of the second transformer coil 104 used for the LNA input). For example, the capacitance values of the tunable transformer may be adjusted as shown in FIG. 7 to facilitate a substantially constant LNA gain at different frequencies, as represented by the gain versus frequency graph in FIG. 7.

Figure 8:
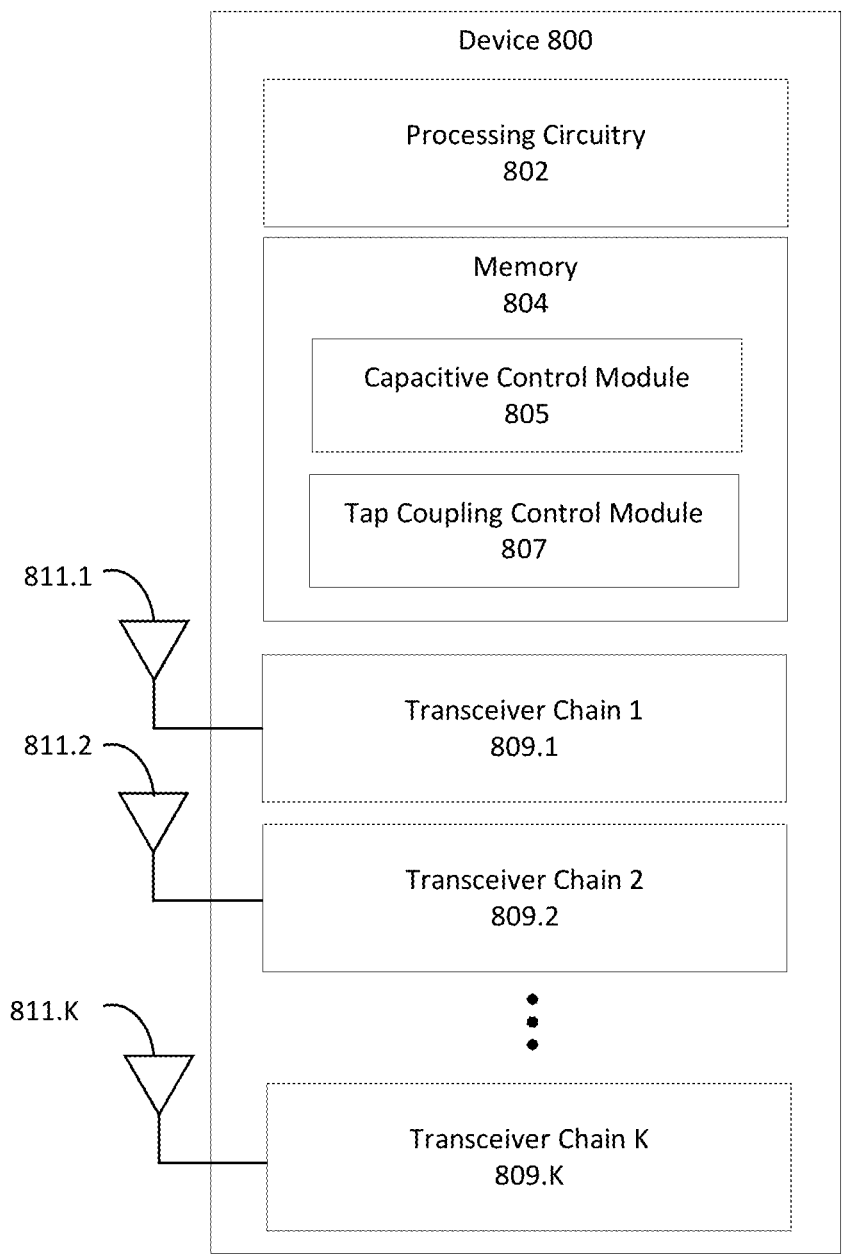
FIG. 8 illustrates a block diagram of an exemplary device, in accordance with an aspect of the disclosure.

FIG. 8 illustrates a block diagram of an exemplary device, in accordance with an aspect of the disclosure. In an aspect, the device 800 may include processing circuitry 802, a memory 804, and any suitable number K of transceiver chains 809.1-809.K, each being coupled to one or more respective antennas 811.1-811.N. The components shown in FIG. 8 are provided for ease of explanation, and aspects include device 800 including additional, less, or alternative components as those shown in FIG. 8. For example, device 800 may include one or more power sources, display interfaces, peripheral devices, ports, etc. To provide additional examples, the device 800 may further include one or more receiver chains or transmit chains in place of one or more of the transceiver chains 809.1-809.K.

In an aspect, the various components of device 800 may be identified with functionality further described herein with reference to the generation of electronic control signals for controlling the state of one or more components of the tunable transformer implementations as discussed herein. For example, the device 800 may be configured to receive and/or transmit signals via one or more of transceiver chains 809.1-809.K, which are wirelessly received and/or transmitted via the coupled antennas 811.1-811.K at any suitable frequency or band of frequencies, and/or in accordance with any suitable number and type of communication protocols. Each of the transceiver chains 809.1-809.K may be identified with, for example, a transceiver chain having a receive chain and a transmit chain as described herein with reference to the various implementations of the tunable transformer.

To do so, processing circuitry 802 may be configured as any suitable number and/or type of computer processors, which may function to control the device 800 as discussed herein. Processing circuitry 802 may be identified with one or more processors (or suitable portions thereof) implemented by the device 800. As discussed herein, processing circuitry 802 may, for example, be identified with one or more processors implemented by the device 800 such as a host processor of the device 800, a digital signal processor, one or more microprocessors, microcontrollers, an application-specific integrated circuit (ASIC), etc. In any event, aspects include the processing circuitry 802 being configured to carry out instructions to perform arithmetical, logical, and/or input/output (I/O) operations, and/or to control the operation of one or more components of the device 800.

For example, the processing circuitry 802 can include one or more microprocessor cores, memory registers, buffers, clocks, etc., and may generate electronic control signals associated with electronic components to tune one or more tunable transformers as discussed herein. Moreover, aspects include processing circuitry 802 communicating with and/or controlling functions associated with the memory 804 and/or other components of the transceiver chains 809.1-809.K. This may include, for example, monitoring signals received via one or more of antennas 811.811.K, determining a desired capacitive value, switch state, and/or tap combination based upon a desired frequency of operation or other feedback, etc.

In an aspect, the memory 804 stores data and/or instructions such that, when the instructions are executed by the processing circuitry 802, the processing circuitry 802 performs various functions described herein. The memory 804 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 804 can be non-removable, removable, or a combination of both.

For example, the memory 804 may be implemented as a non-transitory computer readable medium storing one or more executable instructions such as, for example, logic, algorithms, code, etc. As further discussed below, the instructions, logic, code, etc., stored in the memory 804 are represented by the various modules as shown in FIG. 8, which may enable the aspects disclosed herein to be functionally realized. Alternatively, if the aspects described herein are implemented via hardware, the modules shown in FIG. 8 associated with the memory 804 may include instructions and/or code to facilitate control and/or monitor the operation of such hardware components. In other words, the modules shown in FIG. 8 are provided for ease of explanation regarding the functional association between hardware and software components. Thus, aspects include the processing circuitry 802 executing the instructions stored in these respective modules in conjunction with one or more hardware components to perform the various functions associated with the aspects as further discussed herein.

In an aspect, the executable instructions stored in capacitive control module 805 may facilitate, in conjunction with the processing circuitry 802, the determination of the switching state of a switch that selectively couples and decouples additional transformer coils, as well as the calculation, determination, and/or adjustment of capacitive tuning values for the various transformer architectures as discussed herein. Aspects include changes to the switch state and/or the capacitive values being performed via the generation and transmission of electronic control signals to the respective components of the tunable transformer (e.g., switches and/or electronically tunable capacitors as discussed above).

In an aspect, the executable instructions stored in the tap coupling control module 807 may facilitate, in conjunction with the processing circuitry 802, the calculation, determination and/or control of the tap selection associated with one or more transformer coils within the tunable transformer architecture as discussed herein. In various aspects, the processing circuitry 802 may execute instructions stored in capacitive control module 805 in conjunction with tap coupling control module 807 as part of an overall transformer tuning algorithm or process.

To provide an illustrative example, aspects include processing circuity accessing a lookup table (LUT) or other accessible data stored in the memory 804 and/or in a separate memory not shown in FIG. 8 that defines various tunability settings for specific modes of device operation, which may be based upon the particular implementation of the tunable transformer as discussed herein. This mode of operation may include, for example, a transmitter, receiver, or oscillator frequency or band of frequencies being currently implemented, a desired output power level or gain at this frequency, etc. The tunability settings may include, for instance, switch states to selectively couple or decouple the additional transformer coils and/or capacitors within a capacitor bank within the tunable transformer architecture, and/or the capacitance values of electronically-tuned capacitors. These tunability settings may also include inductance values for one or more multi-tap transformer coils and the accompanying switch settings that result in these multi-tap transformer coils being coupled to other electronic components via the appropriate taps to provide this inductance value. The tunability settings may be predefined based upon calibrated testing (e.g., during manufacturing), or derived as part of a feedback monitored via the device 800. The tunability settings may be stored and/or updated as needed to ensure that the tunability settings provide the desired result for varying operating conditions over time.

EXAMPLES

The following examples pertain to further aspects.

Example 1 is a tunable transformer, comprising: a first transformer coil; a second transformer coil inductively coupled to the first transformer coil, the second transformer coil having a plurality of taps, with different tap pairs within the plurality of taps being selectively coupled to radio frequency (RF) circuitry to yield different respective inductance values; and a third transformer coil coupled to a variable capacitance, the third transformer coil being selectively coupled to the first transformer coil and the second transformer coil.

In Example 2, the subject matter of Example 1, wherein the variable capacitance associated with the third transformer coil has a capacitance that is varied based upon an electronic control signal.

In Example 3, the subject matter of one or more of Examples 1-2, wherein the variable capacitance associated with the third transformer coil includes a capacitor bank having a capacitance that is varied based upon an electronic control signal, and wherein at least one switch included in the electronically-controlled capacitor bank selectively couples the third transformer coil to the first transformer coil and the second transformer coil.

In Example 4, the subject matter of one or more of Examples 1-3, wherein the first transformer coil, the second transformer coil, and the third transformer coil are formed as planar coils on a common die.

In Example 5, the subject matter of one or more of Examples 1-4, wherein: the first transformer coil is coupled to a transmitter, the second transformer coil is coupled to a load, and the first transformer coil and the second transformer coil form a matching network between the transmitter and the RF circuitry such that a signal generated via the transmitter is coupled to the RF circuitry as a transmit signal having an output power and a resonant frequency that are a result of tuning characteristics associated with the matching network.

In Example 6, the subject matter of one or more of Examples 1-5, wherein coupling the third transformer coil to the first transformer coil and the second transformer coil changes the tuning characteristics of the matching network to adjust the resonant frequency.

In Example 7, the subject matter of one or more of Examples 1-6, wherein the tap pairs associated with the second transformer coil that are coupled to the RF circuitry are switched when the resonant frequency is adjusted as a result of the third transformer coil being coupled to the first transformer coil and the second transformer coil, and wherein the switched tap pairs further change the tuning characteristics of the matching network to compensate for a reduction in the output power.

In Example 8, the subject matter of one or more of Examples 1-7, wherein: the first transformer coil is coupled to a first power amplifier, the RF circuitry coupled to the second transformer coil includes a second power amplifier, the first transformer coil and the second transformer coil form a matching network between the first power amplifier and the second first power amplifier, and the first power amplifier and the second power amplifier form part of a multi-stage amplifier.

In Example 9, the subject matter of one or more of Examples 1-8, wherein the first transformer coil is coupled to an oscillator circuit.

In Example 10, the subject matter of one or more of Examples 1-9, wherein: the first transformer coil is coupled to a transmission line that is part of a receive chain, the RF circuitry coupled to the second transformer coil includes a low-noise amplifier (LNA), and the first transformer coil and the second transformer coil form a matching network between the transmission line and an input to the LNA.

Example 11 is a transmit chain, comprising: a power amplifier (PA); and a matching network coupled to the PA and to RF circuitry, the matching network including: a first transformer coil associated with an input port that is coupled to the PA; a second transformer coil associated with an output port that is coupled to the RF circuitry, wherein the second transformer coil has a plurality of taps, with different tap pairs from among the plurality of taps being configured to be coupled to the RF circuitry to change a first set of tuning characteristics of the matching network; and a third transformer coil that is configured to be selectively coupled to the first transformer coil and the second transformer coil to change a second set of tuning characteristics of the matching network.

In Example 12, the subject matter of Example 11, wherein the third transformer coil is coupled to a variable capacitance that has a capacitance that is varied based upon an electronic control signal.

In Example 13, the subject matter of one or more of Examples 11-12, wherein the third transformer coil is coupled to a capacitor bank that has a capacitance that is varied based upon an electronic control signal, and wherein at least one switch included in the capacitor bank selectively couples the third transformer coil to the first transformer coil and the second transformer coil.

In Example 14, the subject matter of one or more of Examples 11-13, wherein the first transformer coil, the second transformer coil, and the third transformer coil that form the matching network are formed as planar coils on a common die.

In Example 15, the subject matter of one or more of Examples 11-14, wherein the PA generates a signal that is coupled to the RF circuitry as a transmit signal having an output power and a resonant frequency that are a result of the tuning characteristics associated with the matching network.

In Example 16, the subject matter of one or more of Examples 11-15, wherein coupling the third transformer coil to the first transformer coil and the second transformer coil changes the second set of tuning characteristics of the matching network to adjust the resonant frequency.

In Example 17, the subject matter of one or more of Examples 11-16, wherein the tap pairs associated with the second transformer coil that are coupled to the RF circuitry are switched when the resonant frequency is adjusted as a result of the third transformer coil being coupled to the first transformer coil and the second transformer coil, and wherein the switched tap pairs change the first set of tuning characteristics of the matching network to compensate for a reduction in the output power.

Example 18 is a wireless device, comprising: a transmit chain that includes a power amplifier (PA); and a matching network coupled to the PA and to a transmission line that is coupled to an antenna, the matching network including: a first transformer coil associated with an input port that is coupled to the PA; a second transformer coil associated with an output port that is coupled to the transmission line, wherein the second transformer coil has a plurality of taps, with different tap pairs from among the plurality of taps being configured to be coupled to the transmission line to change a first set of tuning characteristics of the matching network; and a third transformer coil that is configured to be selectively coupled to the first transformer coil and the second transformer coil to change a second set of tuning characteristics of the matching network.

In Example 19, the subject matter of Example 18, wherein the third transformer coil is coupled to a variable capacitance that has a capacitance that is varied based upon an electronic control signal.

In Example 20, the subject matter of one or more of Examples 18-19, wherein the third transformer coil is coupled to a capacitor bank that has a capacitance that is varied based upon an electronic control signal, and wherein at least one switch included in the capacitor bank selectively couples the third transformer coil to the first transformer coil and the second transformer coil.

In Example 21, the subject matter of one or more of Examples 18-20, wherein the first transformer coil, the second transformer coil, and the third transformer coil that form the matching network are formed as planar coils on a common die.

In Example 22, the subject matter of one or more of Examples 18-21, wherein the PA generates a signal that is coupled to the transmission line as a transmit signal having an output power and a resonant frequency that are a result of the tuning characteristics associated with the matching network.

In Example 23, the subject matter of one or more of Examples 18-22, wherein coupling the third transformer coil to the first transformer coil and the second transformer coil changes the second set of tuning characteristics of the matching network to adjust the resonant frequency.

In Example 24, the subject matter of one or more of Examples 18-23, wherein the tap pairs associated with the second transformer coil that are coupled to the RF circuitry are switched when the resonant frequency is adjusted as a result of the third transformer coil being coupled to the first transformer coil and the second transformer coil, and wherein the switched tap pairs change the first set of tuning characteristics of the matching network to compensate for a reduction in the output power.

Example 25 is a tunable transformer means, comprising: a first transformer means; a second transformer means inductively coupled to the first transformer means, the second transformer means having a plurality of taps, with different tap pairs within the plurality of taps being selectively coupled to radio frequency (RF) circuitry to yield different respective inductance values; and a third transformer means coupled to a variable capacitance means, the third transformer means being selectively coupled to the first transformer means and the second transformer means.

In Example 26, the subject matter of Example 25, wherein the variable capacitance means associated with the third transformer means has a capacitance that is varied based upon an electronic control signal.

In Example 27, the subject matter of one or more of Examples 25-26, wherein the variable capacitance means associated with the third transformer means includes a capacitor bank means having a capacitance that is varied based upon an electronic control signal, and wherein at least one switching means included in the electronically-controlled capacitor bank means selectively couples the third transformer means to the first transformer means and the second transformer means.

In Example 28, the subject matter of one or more of Examples 25-27, wherein the first transformer means, the second transformer means, and the third transformer means are formed as planar coils on a common die.

In Example 29, the subject matter of one or more of Examples 25-28, wherein: the first transformer means is coupled to a transmitter, the second transformer coil is coupled to a load, and the first transformer means and the second transformer means form a matching network means between the transmitter and the RF circuitry such that a signal generated via the transmitter is coupled to the RF circuitry as a transmit signal having an output power and a resonant frequency that are a result of tuning characteristics associated with the matching network means.

In Example 30, the subject matter of one or more of Examples 25-29, wherein coupling the third transformer means to the first transformer means and the second transformer means changes the tuning characteristics of the matching network means to adjust the resonant frequency.

In Example 31, the subject matter of one or more of Examples 25-30, wherein the tap pairs associated with the second transformer means that are coupled to the RF circuitry are switched when the resonant frequency is adjusted as a result of the third transformer means being coupled to the first transformer means and the second transformer means, and wherein the switched tap pairs further change the tuning characteristics of the matching network means to compensate for a reduction in the output power.

In Example 32, the subject matter of one or more of Examples 25-31, wherein: the first transformer means is coupled to a first power amplifier means, the RF circuitry coupled to the second transformer means includes a second power amplifier means, the first transformer means and the second transformer means form a matching network means between the first power amplifier means and the second first power amplifier means, and the first power amplifier means and the second power amplifier means form part of a multi-stage amplifier means.

In Example 33, the subject matter of one or more of Examples 25-32, wherein the first transformer means is coupled to an oscillator circuit means.

In Example 34, the subject matter of one or more of Examples 25-33, wherein: the first transformer means is coupled to a transmission line that is part of a receive chain, the RF circuitry coupled to the second transformer means includes a low-noise amplifier (LNA) means, and the first transformer means and the second transformer means form a matching network means between the transmission line and an input to the LNA means.

Example 35 is a transmit means, comprising: a power amplifier (PA) means; and a matching network means coupled to the PA means and to RF circuitry, the matching network means including: a first transformer means associated with an input port that is coupled to the PA means; a second transformer means associated with an output port that is coupled to the RF circuitry, wherein the second transformer means has a plurality of taps, with different tap pairs from among the plurality of taps being configured to be coupled to the RF circuitry to change a first set of tuning characteristics of the matching network means; and a third transformer means that is configured to be selectively coupled to the first transformer means and the second transformer means to change a second set of tuning characteristics of the matching network means.

In Example 36, the subject matter of Example 35, wherein the third transformer means is coupled to a variable capacitance means that has a capacitance that is varied based upon an electronic control signal.

In Example 37, the subject matter of one or more of Examples 35-36, wherein the third transformer means is coupled to a capacitor bank means that has a capacitance that is varied based upon an electronic control signal, and wherein at least one switching means included in the capacitor bank means selectively couples the third transformer means to the first transformer means and the second transformer means.

In Example 38, the subject matter of one or more of Examples 35-37, wherein the first transformer means, the second transformer means, and the third transformer means that form the matching network means are formed as planar coils on a common die.

In Example 39, the subject matter of one or more of Examples 35-38, wherein the PA means generates a signal that is coupled to the RF circuitry as a transmit signal having an output power and a resonant frequency that are a result of the tuning characteristics associated with the matching network means.

In Example 40, the subject matter of one or more of Examples 35-39, wherein coupling the third transformer means to the first transformer means and the second transformer means changes the second set of tuning characteristics of the matching network means to adjust the resonant frequency.

In Example 41, the subject matter of one or more of Examples 35-40, wherein the tap pairs associated with the second transformer means that are coupled to the RF circuitry are switched when the resonant frequency is adjusted as a result of the third transformer means being coupled to the first transformer means and the second transformer means, and wherein the switched tap pairs change the first set of tuning characteristics of the matching network means to compensate for a reduction in the output power.

Example 42 is a wireless device means, comprising: a transmit means that includes a power amplifier (PA) means; and a matching network means coupled to the PA means and to a transmission line that is coupled to an antenna, the matching network means including: a first transformer means associated with an input port that is coupled to the PA means; a second transformer means associated with an output port that is coupled to the transmission line, wherein the second transformer means has a plurality of taps, with different tap pairs from among the plurality of taps being configured to be coupled to the transmission line to change a first set of tuning characteristics of the matching network means; and a third transformer means that is configured to be selectively coupled to the first transformer means and the second transformer means to change a second set of tuning characteristics of the matching network means.

In Example 43, the subject matter of Example 42, wherein the third transformer means is coupled to a variable capacitance means that has a capacitance that is varied based upon an electronic control signal.

In Example 44, the subject matter of one or more of Examples 42-43, wherein the third transformer means is coupled to a capacitor bank means that has a capacitance that is varied based upon an electronic control signal, and wherein at least one switching means included in the capacitor bank means selectively couples the third transformer means to the first transformer means and the second transformer means.

In Example 45, the subject matter of one or more of Examples 42-44, wherein the first transformer means, the second transformer means, and the third transformer means that form the matching network are formed as planar coils on a common die.

In Example 46, the subject matter of one or more of Examples 42-45, wherein the PA means generates a signal that is coupled to the transmission line as a transmit signal having an output power and a resonant frequency that are a result of the tuning characteristics associated with the matching network means.

In Example 47, the subject matter of one or more of Examples 42-46, wherein coupling the third transformer means to the first transformer means and the second transformer means changes the second set of tuning characteristics of the matching network means to adjust the resonant frequency.

In Example 48, the subject matter of one or more of Examples 42-47, wherein the tap pairs associated with the second transformer means that are coupled to the RF circuitry are switched when the resonant frequency is adjusted as a result of the third transformer means being coupled to the first transformer means and the second transformer means, and wherein the switched tap pairs change the first set of tuning characteristics of the matching network means to compensate for a reduction in the output power.

An apparatus as shown and described.
A method as shown and described.

CONCLUSION

The tunable transformer aspects described herein may be implemented as matching networks or a part of a larger matching network, in various aspects. For example, the tunable transformers 502.1-502.N-1 as shown in FIG. 5 form part of a multistage amplifier 500. In this implementation, although not shown in FIG. 5 for purposes of brevity, the multistage amplifier may include additional matching impedances between each power amplifier 501.1-501.N, at an input to power amplifier 501.1, at an output of power amplifier 501.N, etc. Thus, the tunable transformers as described herein may function as matching networks alone or in conjunction with other matching impedances to ensure that a source impedance is suitably matched to a load impedance. Of course, the terms "source" and "load" in this context may depend upon the particular application or circuit architecture that the tunable transformer is implemented. For example, with reference to FIG. 1A, the load impedance $Z_L$ may be identified with an antenna and transmission line, and the source impedance may represent an equivalent impedance of the PA. However, with reference to FIG. 7, the source impedance may represent the transmission line and antenna, whereas the load impedance may be identified with the impedance of the LNA.

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect.

Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A tunable transformer, comprising:
a first transformer coil coupled to a transmitter;
a second transformer coil that is (i) coupled to a load, and (ii) inductively coupled to the first transformer coil, the second transformer coil having a plurality of taps, with different tap pairs within the plurality of taps being selectively coupled to radio frequency (RF) circuitry to yield different respective inductance values; and
a third transformer coil coupled to a variable capacitance, the third transformer coil being selectively coupled to the first transformer coil and the second transformer coil,
wherein the first transformer coil and the second transformer coil form a matching network between the transmitter and the RF circuitry such that a signal generated via the transmitter is coupled to the RF circuitry as a transmit signal having an output power and a resonant frequency that are a result of tuning characteristics associated with the matching network.

2. The tunable transformer of claim 1, wherein the variable capacitance associated with the third transformer coil has a capacitance that is varied based upon an electronic control signal.

3. The tunable transformer of claim 1, wherein the variable capacitance associated with the third transformer coil includes a capacitor bank having a capacitance that is varied based upon an electronic control signal, and
wherein at least one switch included in the electronically-controlled capacitor bank selectively couples the third transformer coil to the first transformer coil and to the second transformer coil.

4. The tunable transformer of claim 1, wherein the first transformer coil, the second transformer coil, and the third transformer coil are formed as planar coils on a common die.

5. The tunable transformer of claim 1, wherein coupling the third transformer coil to the first transformer coil and to the second transformer coil changes the tuning characteristics of the matching network to adjust the resonant frequency.

6. The tunable transformer of claim 5, wherein the tap pairs associated with the second transformer coil that are coupled to the RF circuitry are switched when the resonant frequency is adjusted as a result of the third transformer coil being coupled to the first transformer coil and to the second transformer coil, and
wherein the switched tap pairs further change the tuning characteristics of the matching network to compensate for a reduction in the output power.

7. The tunable transformer of claim 1, wherein:
the first transformer coil is coupled to a first power amplifier,
the RF circuitry coupled to the second transformer coil includes a second power amplifier,
the matching network is formed between the first power amplifier and the second first power amplifier, and
the first power amplifier and the second power amplifier form part of a multi-stage amplifier.

8. The tunable transformer of claim 1, wherein the first transformer coil is coupled to an oscillator circuit.

9. The tunable transformer of claim 1, wherein:
the first transformer coil is coupled to a transmission line that is part of a receive chain,
the RF circuitry coupled to the second transformer coil includes a low-noise amplifier (LNA), and
the matching network is formed between the transmission line and an input to the LNA.

10. A transmit chain, comprising:
a power amplifier (PA); and
a matching network coupled to the PA and to RF circuitry, the matching network including:
a first transformer coil associated with an input port that is coupled to the PA;
a second transformer coil associated with an output port that is coupled to the RF circuitry, wherein the second transformer coil has a plurality of taps, with different tap pairs from among the plurality of taps being configured to be coupled to the RF circuitry to change a first set of tuning characteristics of the matching network; and a third transformer coil that is configured to be selectively coupled to the first transformer coil and the second transformer coil to change a second set of tuning characteristics of the matching network.

11. The transmit chain of claim 10, wherein the third transformer coil is coupled to a variable capacitance that has a capacitance that is varied based upon an electronic control signal.

12. The transmit chain of claim 10, wherein the third transformer coil is coupled to a capacitor bank that has a capacitance that is varied based upon an electronic control signal, and
wherein at least one switch included in the capacitor bank selectively couples the third transformer coil to the first transformer coil and to the second transformer coil.

13. The transmit chain of claim 10, wherein the first transformer coil, the second transformer coil, and the third transformer coil that form the matching network are formed as planar coils on a common die.

14. The transmit chain of claim 10, wherein the PA generates a signal that is coupled to the RF circuitry as a transmit signal having an output power and a resonant frequency that are a result of one of the first set of tuning characteristics or the second set of tuning characteristics associated with the matching network.

15. The transmit chain of claim 14, wherein coupling the third transformer coil to the first transformer coil and the second transformer coil changes the second set of tuning characteristics of the matching network to adjust the resonant frequency.

16. The transmit chain of claim 15, wherein the tap pairs associated with the second transformer coil that are coupled to the RF circuitry are switched when the resonant frequency is adjusted as a result of the third transformer coil being coupled to the first transformer coil and to the second transformer coil, and
wherein the switched tap pairs change the first set of tuning characteristics of the matching network to compensate for a reduction in the output power.

17. A wireless device, comprising:
a transmit chain that includes a power amplifier (PA); and
a matching network coupled to the PA and to a transmission line that is coupled to an antenna, the matching network including:
a first transformer coil associated with an input port that is coupled to the PA;
a second transformer coil associated with an output port that is coupled to the transmission line,
wherein the second transformer coil has a plurality of taps, with different tap pairs from among the plurality of taps being configured to be coupled to the transmission line to change a first set of tuning characteristics of the matching network; and
a third transformer coil that is configured to be selectively coupled to the first transformer coil and the second transformer coil to change a second set of tuning characteristics of the matching network.

18. The wireless device of claim 17, wherein the third transformer coil is coupled to a variable capacitance that has a capacitance that is varied based upon an electronic control signal.

19. The wireless device of claim 17, wherein the third transformer coil is coupled to a capacitor bank that has a capacitance that is varied based upon an electronic control signal, and
wherein at least one switch included in the capacitor bank selectively couples the third transformer coil to the first transformer coil and to the second transformer coil.

20. The wireless device of claim 17, wherein the first transformer coil, the second transformer coil, and the third transformer coil that form the matching network are formed as planar coils on a common die.

21. The wireless device of claim 17, wherein the PA generates a signal that is coupled to the transmission line as a transmit signal having an output power and a resonant frequency that are a result of one of the first set of tuning characteristics or the second set of tuning characteristics associated with the matching network.

22. The wireless device of claim 21, wherein coupling the third transformer coil to the first transformer coil and to the second transformer coil changes the second set of tuning characteristics of the matching network to adjust the resonant frequency.

23. The wireless device of claim 22, wherein the tap pairs associated with the second transformer coil that are coupled to the RF circuitry are switched when the resonant frequency is adjusted as a result of the third transformer coil being coupled to the first transformer coil and the second transformer coil, and
wherein the switched tap pairs change the first set of tuning characteristics of the matching network to compensate for a reduction in the output power.

24. A tunable transformer, comprising:
a first transformer coil coupled to a first power amplifier;
a second transformer coil inductively coupled to the first transformer coil, the second transformer coil having a plurality of taps, with different tap pairs within the plurality of taps being selectively coupled to radio frequency (RF) circuitry to yield different respective inductance values, the RF circuitry comprising a second power amplifier; and
a third transformer coil coupled to a variable capacitance, the third transformer coil being selectively coupled to the first transformer coil and to the second transformer coil,
wherein the first transformer coil and the second transformer coil form a matching network between the first power amplifier and the second first power amplifier, and
wherein the first power amplifier and the second power amplifier form part of a multi-stage amplifier.

25. A tunable transformer, comprising:
a first transformer coil coupled to a transmission line that is part of a receive chain;
a second transformer coil that is (i) coupled to a load, and (ii) inductively coupled to the first transformer coil, the second transformer coil having a plurality of taps, with different tap pairs within the plurality of taps being selectively coupled to radio frequency (RF) circuitry to yield different respective inductance values, the RF circuitry comprising a low-noise amplifier (LNA); and
a third transformer coil coupled to a variable capacitance, the third transformer coil being selectively coupled to the first transformer coil and to the second transformer coil, wherein the first transformer coil and the second transformer coil form a matching network between the transmission line and an input to the LNA.

\* \* \* \* \*